US009593831B2

(12) United States Patent
 Yu

(10) Patent No.: US 9,593,831 B2
(45) Date of Patent: Mar. 14, 2017

(54) ARTIFICIAL LED LIGHTED CHRISTMAS TREE

(71) Applicant: 1 ENERGY SOLUTIONS, INC., Agoura Hills, CA (US)

(72) Inventor: Jing Jing Yu, El Monte, CA (US)

(73) Assignee: 1 ENERGY SOLUTIONS, INC., Agoura Hills, CA (US)

( * ) Notice: Subject to any disclaimer, the term of this patent is extended or adjusted under 35 U.S.C. 154(b) by 250 days.

(21) Appl. No.: 14/485,406

(22) Filed: Sep. 12, 2014

(65) Prior Publication Data

US 2015/0070878 A1    Mar. 12, 2015

Related U.S. Application Data

(60) Provisional application No. 61/877,173, filed on Sep. 12, 2013.

(51) Int. Cl.
 *H05B 37/02* (2006.01)
 *F21V 23/06* (2006.01)
 (Continued)

(52) U.S. Cl.
 CPC ............ *F21V 23/004* (2013.01); *A47G 33/06* (2013.01); *F21S 4/10* (2016.01); *F21V 23/02* (2013.01); *F21V 23/06* (2013.01); *H05B 33/0806* (2013.01); *F21W 2121/04* (2013.01); *F21Y 2101/00* (2013.01); *H05K 1/18* (2013.01);
 (Continued)

(58) Field of Classification Search
 CPC ....... H05B 37/0227; F21S 4/001; F21V 23/06
 See application file for complete search history.

(56) References Cited

U.S. PATENT DOCUMENTS 1,656,148 A    4/1926    Harris
1,677,972 A    7/1928    Marks
 (Continued)

FOREIGN PATENT DOCUMENTS

CN    2292482    4/1997
CN    2643777    8/2003
 (Continued)

OTHER PUBLICATIONS

Artificial Christmas Tree Assembly, Use & Care Instructions, Balsam Hill; https://web.archive.org/web/20100706111614/http://www.balsamhill.com/ARticles.asp?ID . . . printed Jan. 24, 2014.

*Primary Examiner* — Elmito Breval
(74) *Attorney, Agent, or Firm* — William W. Cochran; Cochran Freund & Young LLC

(57) ABSTRACT

Disclosed are various embodiments of an artificial tree that is lit by LEDs. Individual trunk modules are provided on trunk sections that provide individual control of LED strings disposed on branches on each of the trunk sections. Remote control devices and smart devices connected to the Internet can control the trunk modules. Spring-loaded flat connectors between the trunk sections, and also between the branches in the trunks, provide a solid electrical connection, which has a low susceptibility to failure. Plastic injection molded branches having injected molded sockets are provided for connecting LEDs that can be plugged directly into sockets on the trunk sections. The LEDs can be driven with an AC or DC electrical power supply.

27 Claims, 13 Drawing Sheets

(51) Int. Cl.
- F21V 23/00 (2015.01)
- A47G 33/06 (2006.01)
- F21V 23/02 (2006.01)
- H05B 33/08 (2006.01)
- F21W 121/04 (2006.01)
- H05K 1/18 (2006.01)
- F21Y 101/00 (2016.01)

(52) U.S. Cl.
CPC . *H05K 2201/09027* (2013.01); *Y10T 29/4913* (2015.01); *Y10T 29/49018* (2015.01); *Y10T 29/49117* (2015.01)

(56) References Cited

U.S. PATENT DOCUMENTS

| | | |
|---|---|---|
| 2,214,046 A | 12/1938 | Doran |
| 2,188,529 A | 1/1940 | Corina |
| 2,857,506 A | 10/1958 | Minteer |
| 3,206,593 A | 9/1965 | Winnicki, Sr. |
| 3,603,780 A | 9/1971 | Lu |
| 3,970,834 A | 7/1976 | Smith |
| 3,985,924 A | 10/1976 | Pritza |
| 4,020,201 A | 4/1977 | Miller |
| 4,060,722 A | 11/1977 | Foley |
| 4,068,118 A | 1/1978 | Carrington |
| 4,364,102 A | 12/1982 | Huppert et al. |
| 4,573,102 A | 2/1986 | Norwood |
| 5,517,390 A | 5/1996 | Zins |
| 5,609,412 A | 3/1997 | Contigiani |
| 5,855,705 A | 1/1999 | Gauthier |
| 6,017,142 A | 1/2000 | Harris, Jr. |
| 6,228,442 B1 | 5/2001 | Coco |
| 6,942,355 B1 | 9/2005 | Castiglia |
| 6,951,405 B2 | 10/2005 | Yao |
| 7,052,156 B2 | 5/2006 | Primeau |
| 7,055,981 B2 | 6/2006 | Yao |
| 7,132,139 B2 | 11/2006 | Yang |
| 7,445,824 B2 | 11/2008 | Leung et al. |
| 7,896,516 B1 | 3/2011 | Zhu |
| 8,298,633 B1 | 10/2012 | Chen |
| 8,454,186 B2 | 6/2013 | Chen |
| 8,454,187 B2 | 6/2013 | Chen |
| D686,523 S | 7/2013 | Chen |
| 8,568,015 B2 | 10/2013 | Chen |
| D696,153 S | 12/2013 | Chen |
| 2005/0180163 A1 | 8/2005 | Huang |
| 2006/0044822 A1 | 3/2006 | Katsumata |
| 2006/0164834 A1 | 7/2006 | Kao |
| 2007/0092664 A1 | 4/2007 | Chun |
| 2007/0177402 A1 | 8/2007 | Wu |
| 2007/0253191 A1 | 11/2007 | Chin et al. |
| 2009/0029075 A1 | 1/2009 | Barthelmess |
| 2010/0072747 A1 | 3/2010 | Krize |
| 2012/0076957 A1 | 3/2012 | Chen |
| 2013/0059094 A1 | 3/2013 | Chen |
| 2013/0108808 A1 | 5/2013 | Leung et al. |
| 2013/0120971 A1 | 5/2013 | Chen |
| 2013/0163231 A1 | 6/2013 | Chen |
| 2013/0301245 A1 | 11/2013 | Chen |
| 2013/0301246 A1 | 11/2013 | Chen |
| 2013/0301247 A1 | 11/2013 | Chen |
| 2013/0308301 A1 | 11/2013 | Chen |
| 2014/0049948 A1 | 2/2014 | Chen |
| 2014/0321130 A1* | 10/2014 | Loomis ............. F21V 21/088 362/311.13 |

FOREIGN PATENT DOCUMENTS

| | | |
|---|---|---|
| CN | 2812761 | 9/2004 |
| CN | 2751226 | 11/2004 |
| CN | 2769694 | 11/2004 |
| CN | 201318583 | 11/2008 |
| DE | 8436328 | 4/1985 |
| DE | 10235081 | 8/2002 |
| EP | 1887280 | 8/2006 |
| GB | 1490174 | 12/1975 |
| GB | 2112281 | 10/1981 |
| GB | 2137086 | 2/1983 |
| GB | 2161595 | 7/1984 |
| GB | 2172135 | 3/1986 |
| GB | 2382772 | 12/2001 |
| GB | 2471475 | 6/2009 |
| GB | 2496290 | 10/2012 |
| NL | 9400893 | 1/1994 |
| WO | 9626661 | 9/1996 |
| WO | 2010057426 | 5/2010 |

* cited by examiner

ARTIFICIAL LED LIGHTED CHRISTMAS TREE

CROSS-REFERENCE TO RELATED APPLICATION

The present application is based upon and claims priority to U.S. provisional application Ser. No. 61/877,173, filed Sep. 12, 2013, by Jing Jing Yu, entitled "Artificial LED Lighted Christmas Tree." The entire content of this application is hereby specifically incorporated herein by reference for all it discloses and teaches.

BACKGROUND

Artificial Christmas trees have become increasingly popular because of the convenience of using an artificial tree compared to cut trees. Artificial trees typically are pre-wired with lights, which further increases the convenience of using an artificial tree. In addition, the use of LED lights on an artificial tree reduces hazards because the LED lights do not emit significant heat and the materials used in artificial trees are normally fire-resistant. Cut trees that become dry and are decorated with incandescent bulbs, that can reach high temperatures, and are significantly more hazardous than artificial trees that are made from fire resistant materials and that are pre-wired with LED lights.

SUMMARY

An embodiment of the invention may therefore comprise an artificial tree comprising: a plurality of trunk sections that are adapted to be assembled to form a tree trunk, the plurality of trunk sections having diameters that fit together to mechanically connect the trunk; a plurality of artificial branches; a plurality of individual LED light strings disposed on the artificial branches; a plurality of trunk modules disposed on the plurality of trunk sections, each of the trunk modules of the plurality of trunk modules providing a single power source that is connected to a plurality of electrical light string connectors that connect the individual LED light strings to the single power source in parallel; a plurality of trunk section flat spring connectors that connect electrical power between the trunk sections comprising: springs that are electrically connected to power sources in the trunk modules of the trunk section; connector plates that are electrically connected to the power sources in adjacent trunk modules of adjacent trunk sections, the connector plates disposed in the trunk modules to engage the spring in the adjacent trunk modules when the trunk modules are assembled.

An embodiment of the invention may further comprise a method of assembling an artificial tree comprising: providing a plurality of trunk sections, the plurality of trunk sections having diameters that fit together to form a tree trunk; connecting a plurality of trunk modules to the trunk sections; connecting a plurality of artificial branches to said plurality of trunk modules; placing a plurality of individual light strings on said plurality of artificial branches; connecting the plurality of individual light strings to a single power source in each trunk module of the plurality of trunk modules so that the plurality of individual light strings are connected in parallel with the single power source in the each trunk module; assembling the trunk sections so that spring connectors disposed in the trunk sections provide an electrical conduction path for conduction of electrical power to the plurality of trunk sections, the spring connectors comprising springs that are compressed by connector plates when the trunk sections are assembled, to provide a solid electrical connection to conduct the electrical power to the plurality of trunk sections.

DETAILED DESCRIPTION OF THE EMBODIMENTS

Figure 1:
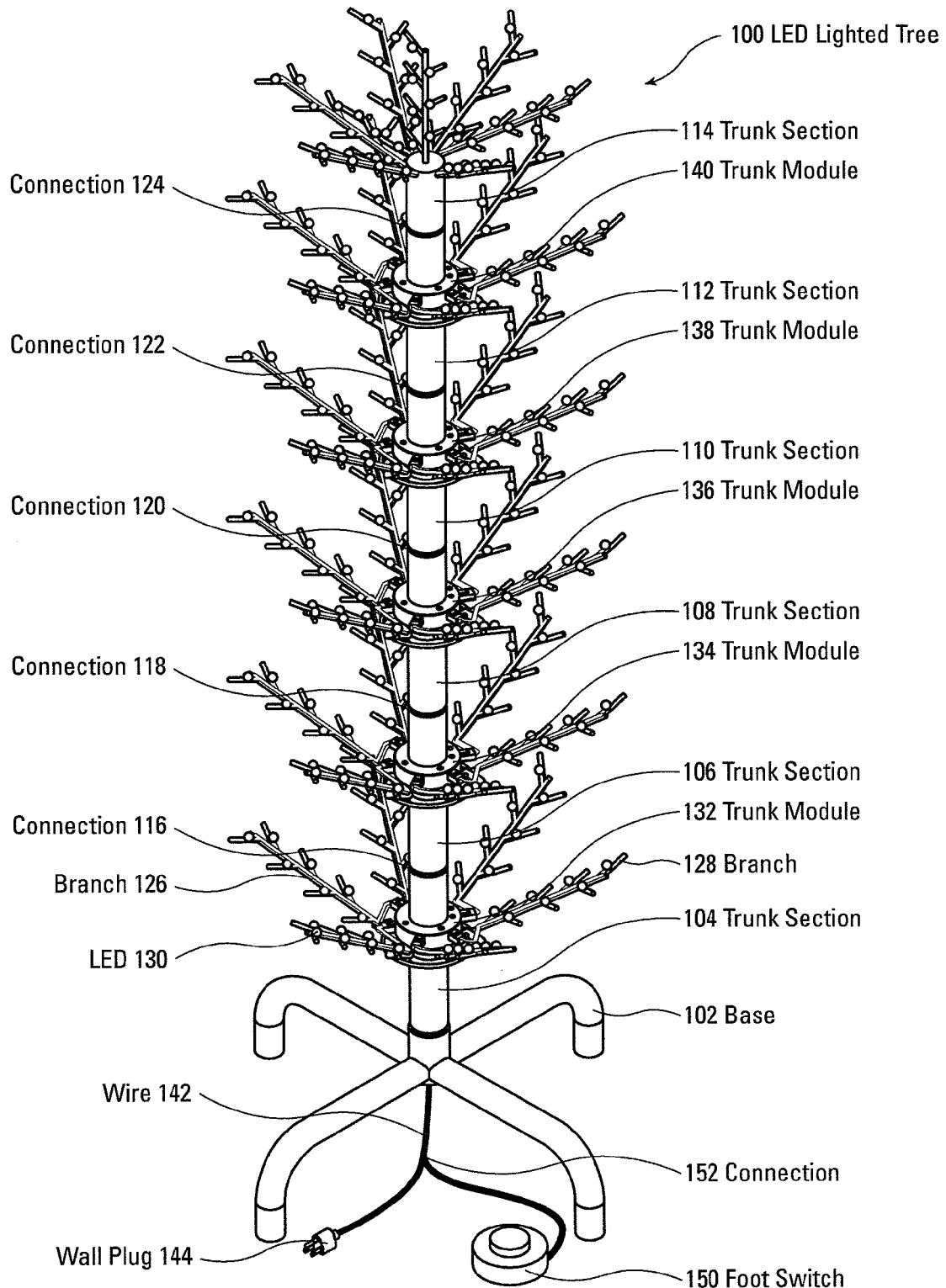
FIG. 1 is an isometric view of an embodiment of an artificial tree using LED lights.

FIG. 1 is an isometric view of an embodiment of an artificial tree 100 that is lit by LEDs. As illustrated in FIG. 1, the LED lighted tree 100 has a base 102 and a trunk section 104 that is mounted in the base 102. Trunk section 106 is mounted on the upper portion of trunk section 104. Similarly, trunk section 108 is mounted on the upper portion of trunk section 106; trunk section 110 is mounted on the upper portion of trunk section 108; trunk section 112 is mounted on the upper portion of trunk section 110; and, trunk section 114 is mounted on the upper portion of trunk section 112. Trunk sections 104-114 are assembled at connections 116, 118, 120, 122, 124. In this manner, the LED lighted tree 100 can be assembled and disassembled easily and stored in a convenient manner. Each of the trunk sections 104-114 includes a trunk module. For example, trunk section 104 includes a trunk module 132; trunk section 106 includes a trunk module 134; trunk section 108 includes a trunk module 136, trunk section 110 includes a trunk module 138; and, trunk section 114 includes an internal trunk module that is not illustrated in FIG. 1.

As also illustrated in FIG. 1, there are a plurality of branches, such as branches 126, 128 that are connected to the trunk modules 132-140. As illustrated in FIG. 1, there are six branches connected to each of the trunk modules 132-140. Of course, any desired number of branches can be connected to the trunk modules 132-140. Each of the branches, such as branches 126, 128 can be pivotally mounted on the trunk sections, as illustrated in FIG. 1, to allow for ease in folding the branches inwardly and storing of the LED lighted tree 100. Wire 142 and wall plug 144 provide power to the LEDs, such as LED 130, that are pre-wired to each of the branches, such as branch 126. A connection 152 can also be provided in the wire 142. The connection 152 connects to a foot switch 150 that allows the user to switch the LED lighted tree 100 on and off using foot switch 150. The connection 152 can be a T-connection or any other type of connection. As disclosed in more detail below, trunk module 132 may convert the AC signal to a safer lower voltage of less than 30 volts AC and apply the neutral wire, which is normally the white wire, to the trunk section 104, which is made of metal, so that the neutral is transmitted throughout the trunk sections 104-114, as well as the metal branches that are illustrated in FIG. 1. Conversion of the AC signal to a lower voltage AC signal can be done by simply using a small transformer. Alternatively, a solid state converter can be used to convert the 117 volt RMS signal to a DC voltage of less than 30 volts which, again, results in a safe voltage for application to the trunk modules 132-140. In that regard, the solid state converter can apply a zero DC voltage to the trunk sections 104-114.

Figure 7A:
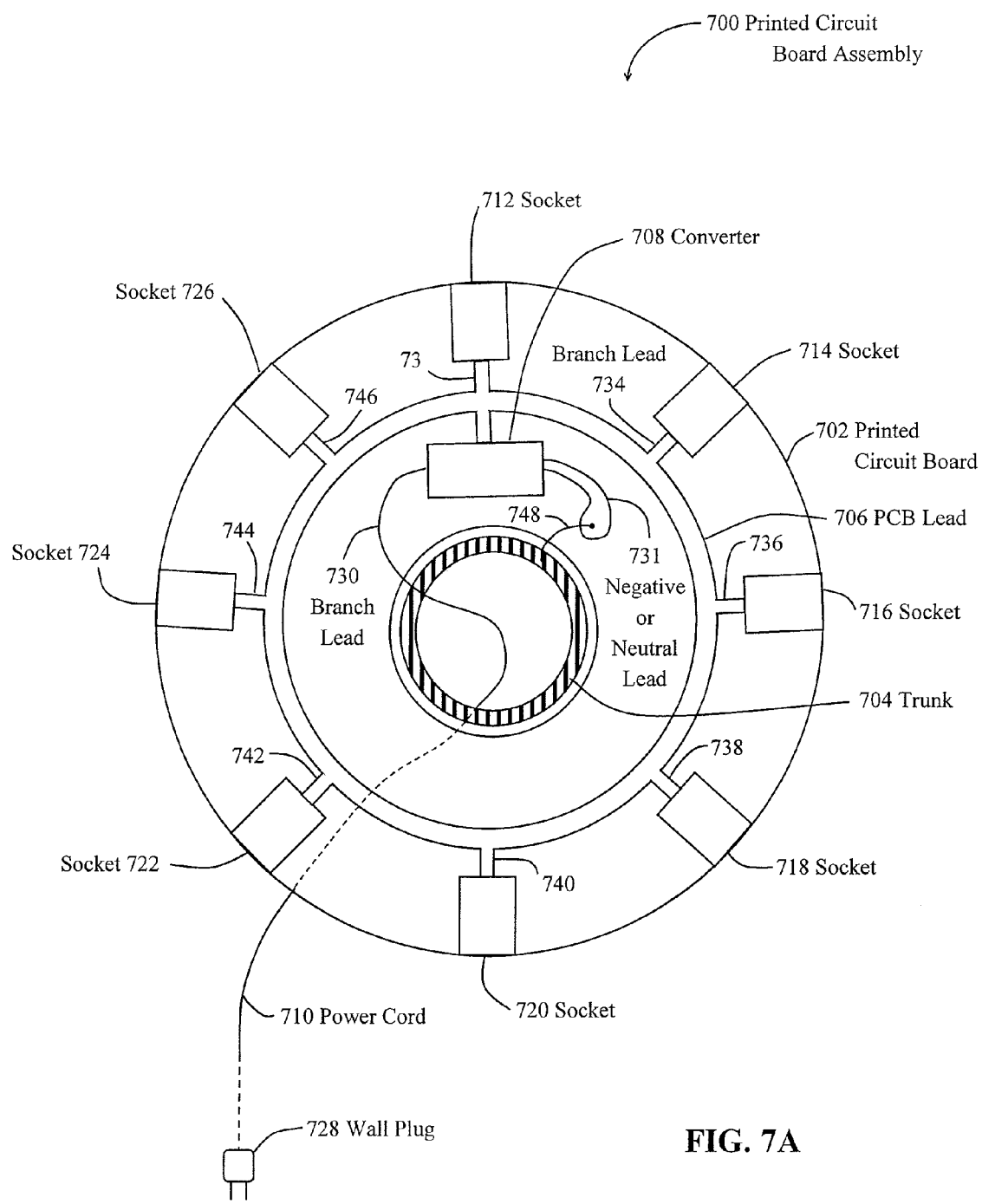
FIG. 7A is a schematic top view of an embodiment of a printed circuit board assembly.
Figure 7B:
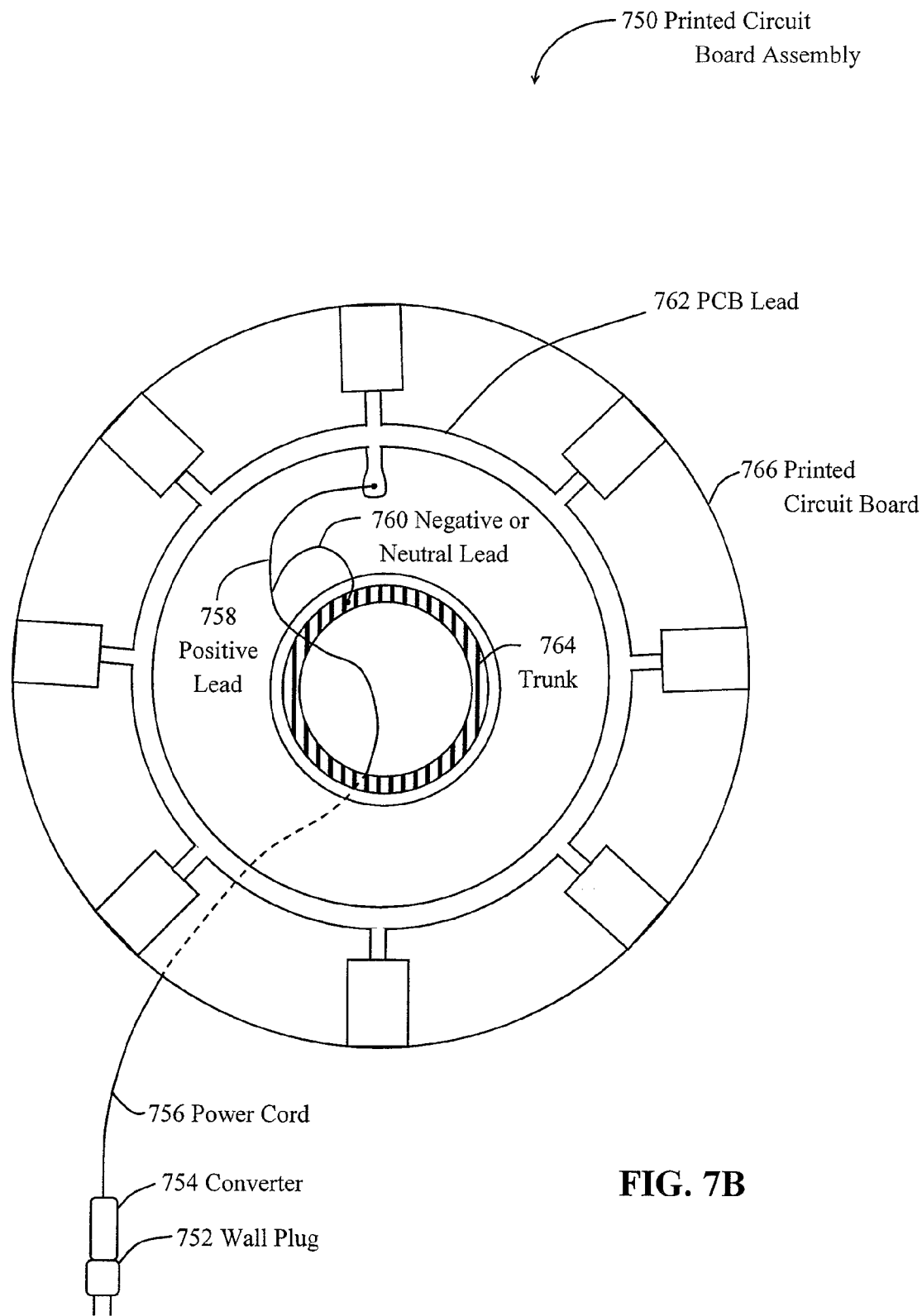
FIG. 7B is a schematic top view of another embodiment of a printed circuit board assembly.
Figure 8:
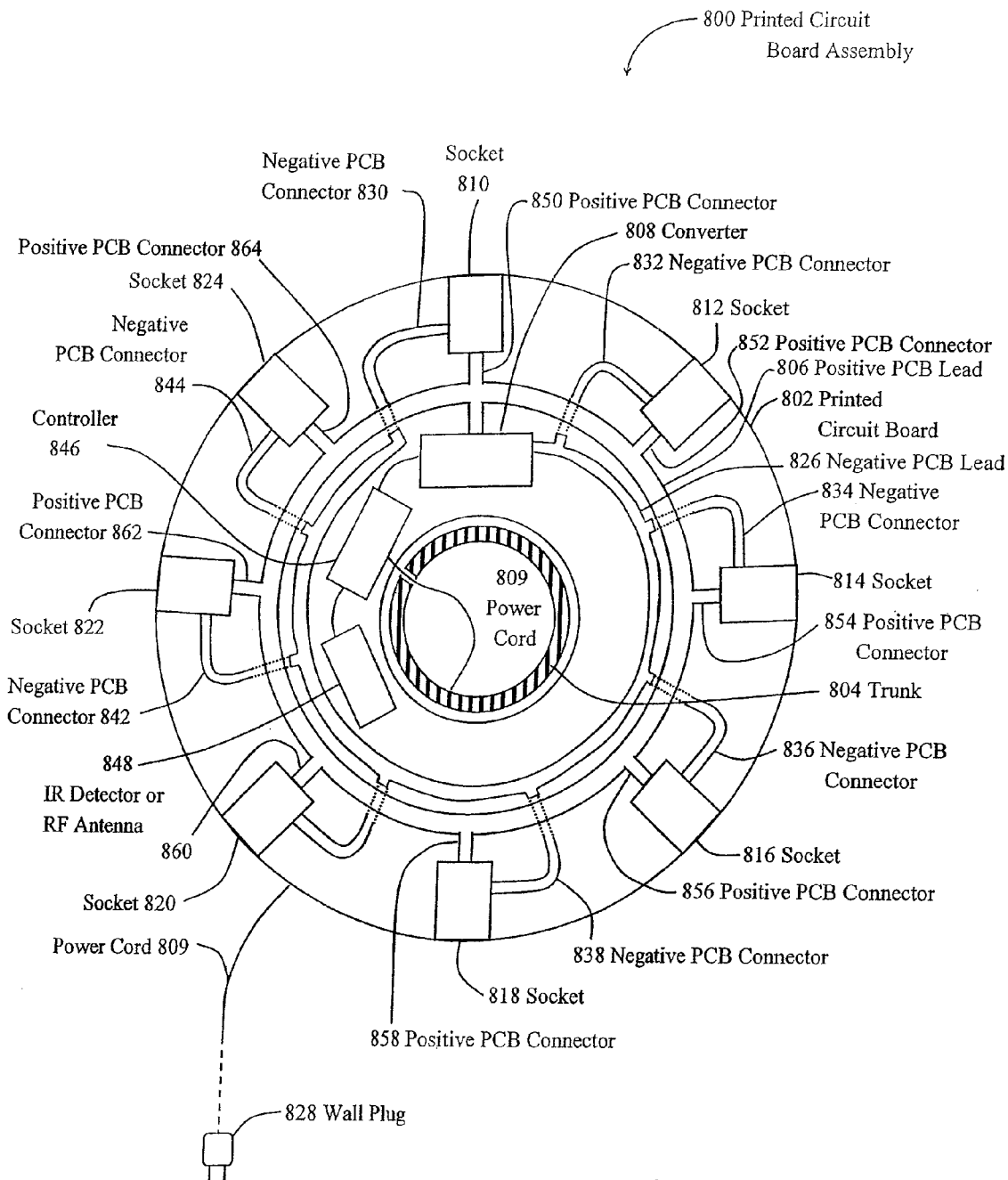
FIG. 8 is a schematic top view of another embodiment of a printed circuit board assembly.
Figure 9:
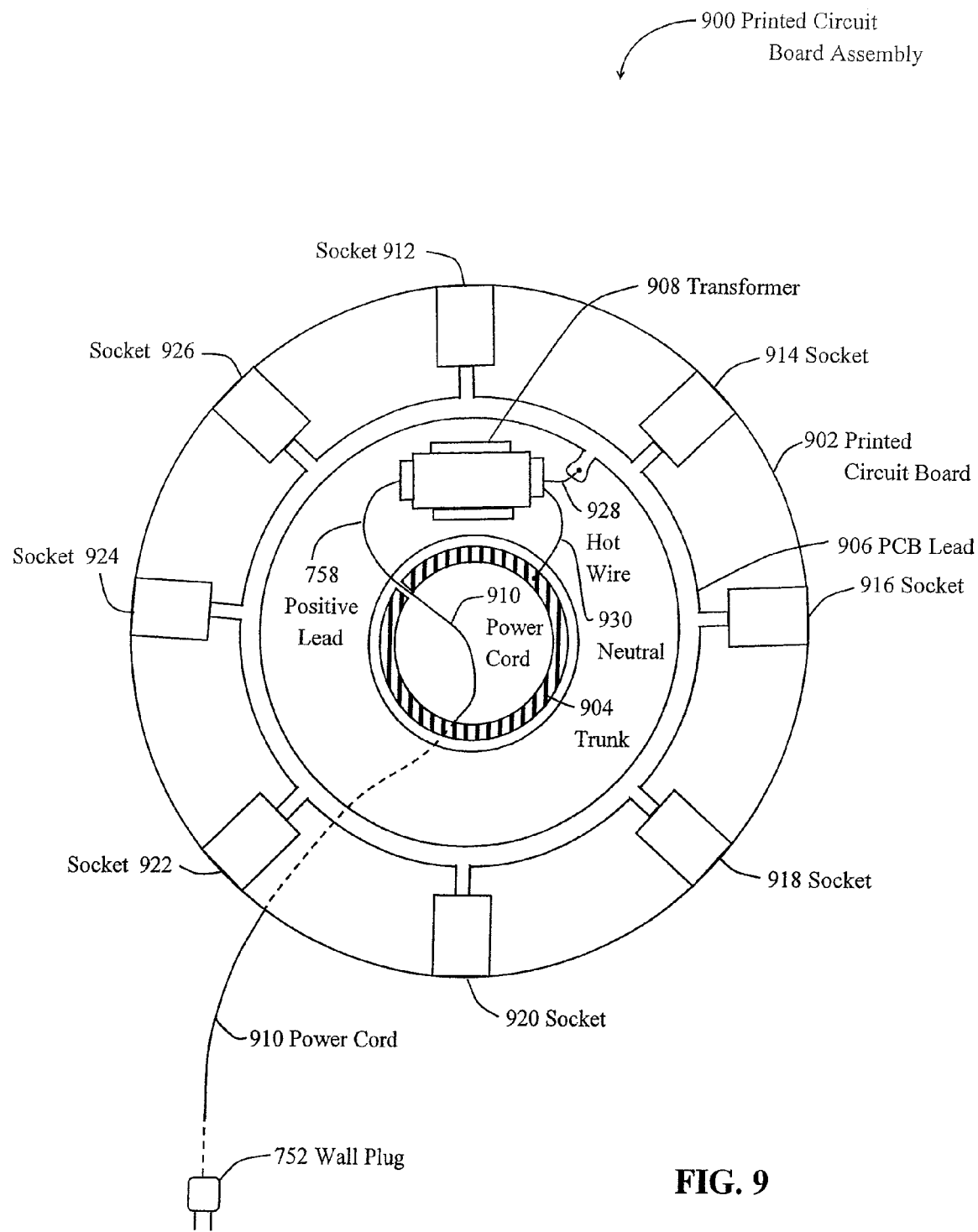
FIG. 9 is a schematic top view of another embodiment of a printed circuit board assembly.

As further shown in FIG. 1, each of the trunk modules 132-140 may include a printed circuit board, such as shown in FIGS. 7, 8 and 9. The printed circuit boards may include electrical converters, so that different voltages and different electrical characteristics can be generated by the printed circuit boards in each of the trunk modules 132-140. For example, module 132, which is the lowest module, may convert the AC power supplied by wire 142, which may be 117 volts RMS, which is standard household power in many countries, to AC power of less than approximately 30 volts. AC power of less than 30 volts is safe to the touch and meets various standards, such as Underwriter Laboratories (UL) standards for safety. As indicated above, the neutral may then be connected to the trunk section 104 and the hot wire connected to the connector that is disposed within the trunk section 104 and trunk section 106 adjacent the connection 116, as disclosed in more detail with respect to FIGS. 3-6. Electrical power of less than 30 volts can then be transmitted to the next trunk module 134 and similarly through each of the trunk modules 136, 138, 140.

Although FIG. 1 illustrates that each trunk module supports six branches, a fewer number of branches may be supported by trunk modules toward the top of the tree. For example, trunk modules in the middle region of the LED lighted tree 100 may have five branches. Trunk modules, such as trunk module 138, 140, may only support four branches. In addition, the branches may be shorter and contain fewer LEDs. As such, lower voltages can be used on the upper modules, where less power is required. Since each module includes a printed circuit board with associated power conversion or inversion circuitry, the desired voltage levels can be generated at each trunk module from a trunk module located at a lower position on the tree. For example, the branches on the lowest level trunk modules, such as trunk module 132, have branches 128 that may include more lights than the branches that are attached to a higher level trunk module, such as trunk module 140, as illustrated in FIG. 1. In that case, a larger voltage will be needed to operate the larger number of lights in each series string on each branch. In other words, the branches on the higher level trunk modules have fewer lights that are connected in series on each branch than the number of lights that are on the lower modules, such as trunk module 132. This is because the branches on the lower trunk modules, such as trunk module 132, are longer and require more lights. The branches on the upper trunk modules, such as trunk module 140, are shorter and require fewer lights. Since the lights may be connected in series on each branch, a larger minimum voltage is needed to operate the lights on the lower branches. The voltage supplied to the series string of LEDs must be greater than the total impedance of the LEDs for an AC power supply, which is the impedance drop across each of the LEDs added together, including any resistance that has been added to the series string to limit current. Because of the low impedance across each of the LEDs, a number of lights can be used in a single string for voltages under 30 volts. Further, since there are a number of branches on each hub, and since each branch has a separate light string, there are a sufficient number of lights that can be used on each branch and still stay under the 30 volt limit. In other words, each branch is connected in parallel to the source voltage, which allows a large number of lights on each branch without exceeding the 30 volt limit.

Figure 2:
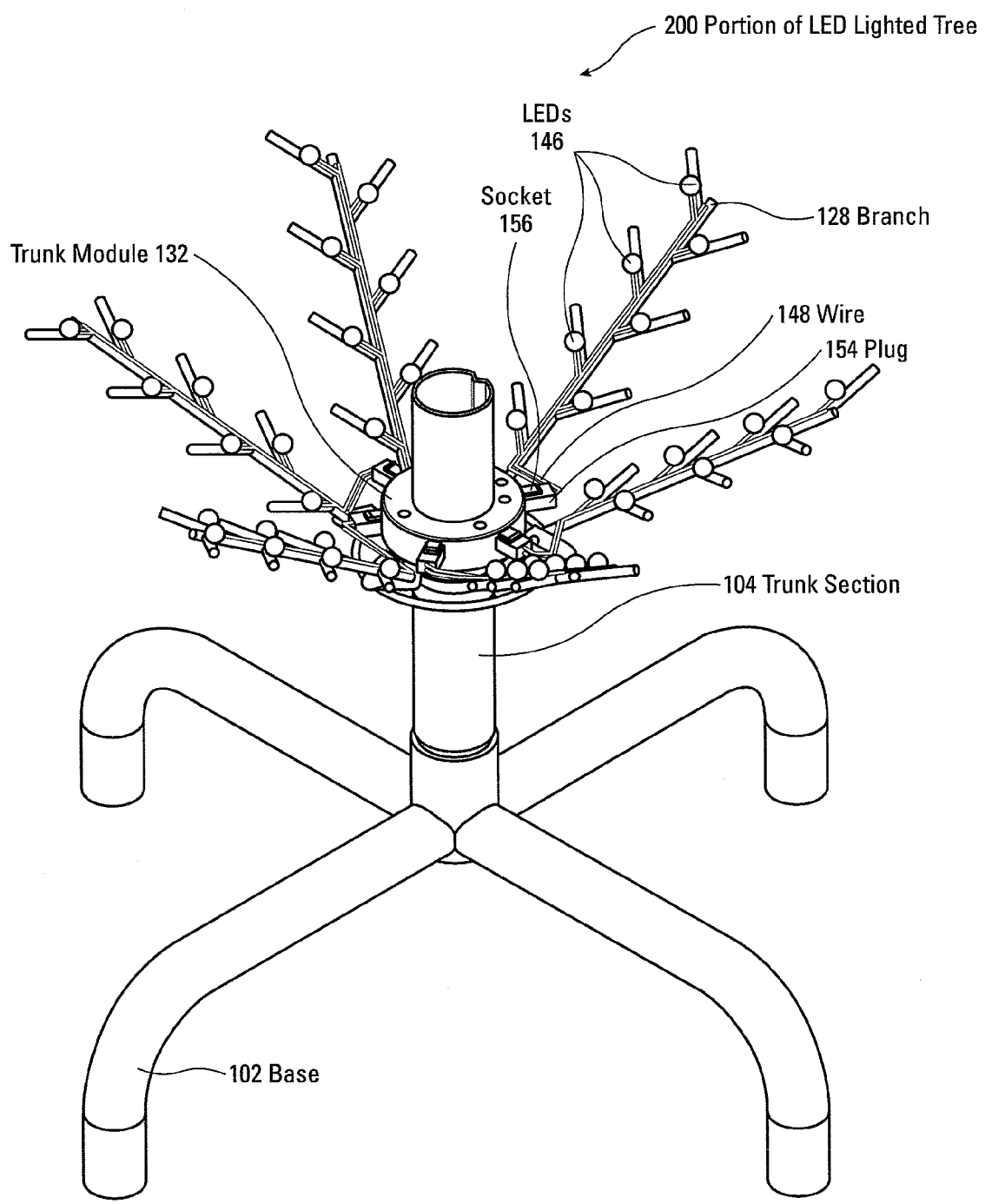
FIG. 2 is an isometric view of a portion of the LED lighted tree of FIG. 1.

FIG. 2 is a schematic isometric view of a portion 200 of the LED lighted tree. As illustrated in FIG. 2, trunk section 104 is connected to the base 102. Trunk module 132 is mounted on the trunk section 104. A plurality of branches, including branch 128, are connected to the trunk module 132. The connection of the branches may be a mechanical pivot, a plug and socket connection, or other connection, as set forth in more detail below. LEDs 146 are connected to a wire 148 to receive power. Wire 148 is connected to a plug 154 that is inserted in a socket 156 in the trunk module 132. Each branch has a separate LED light string, which is separately plugged into the sockets on the trunk module 132 that are illustrated in FIG. 2. Accordingly, if an LED light string goes dark, the LED light string can simply be replaced by unplugging the LED light string from the trunk module 132. Alternatively, the light string can be unplugged from the trunk module and the entire branch replaced when a removable mechanical attachment is used to connect the branch to the trunk module. In that regard, each of the light strings on the branches is a separate straight light string and can be wired in the same manner as icicle strings are wired on a light string. In other words, a central supply of power is available to multiple individual straight light strings on the multiple branches, which are each attached to the same power supply. Each of the light strings illustrated in FIG. 2 is separately connected using a plug, such as plug 154, that connects to a socket, such as socket 156, which are all connected to a single power source. Alternatively, more than one separate string may share a plug.

Figure 3:
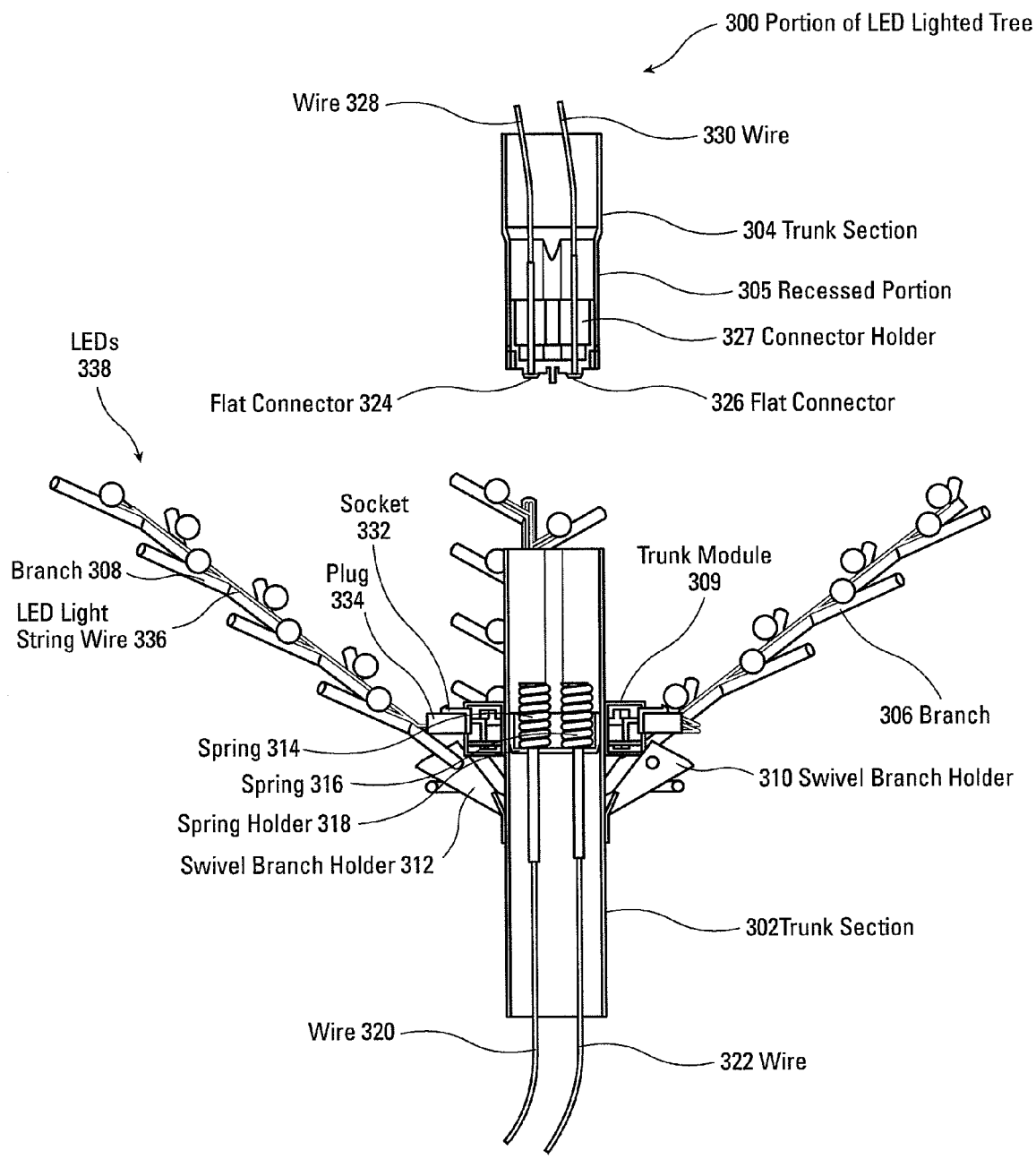
FIG. 3 is a cross-sectional view of a portion of an embodiment of an LED lighted tree.

FIG. 3 is a cross-sectional view of an embodiment of the LED lighted tree 300. As shown in FIG. 3, lower trunk section 302 mates with the upper trunk section 304. Branches, such as branches 306, 308, are coupled to trunk module 309. A swivel branch holder 310 connects the branch 306 to the trunk module 309. Similarly, swivel branch holder 312 connects the branch 308 to the trunk module 309. The LED light string wire 336 is disposed on the branch 308 and provides power to the LEDs 338. The LED light string wire 336 is connected to a plug 334 that is inserted in socket 332 to obtain power for lighting the LEDs 338.

As also illustrated in FIG. 3, trunk section 304 has a recessed portion 305 that fits into the upper portion of the trunk section 302. The inside diameter of the upper portion of the trunk section 302 is just slightly greater than the outside diameter of the recessed portion 305 to provide a snug fit. The weight of the trunk section 304 and the weight of trunk sections above trunk section 304 cause the trunk section 304 to be forced down into, and remain in, the upper portion of the trunk section 302. Springs 314, 316 are disposed in a spring holder 318. The spring holder 318 may be made from a non-conductive material, such as a strong plastic material which is capable of holding springs 314, 316 firmly within the central portion of the trunk section 302. Wires 320, 322 are connected to springs 314, 316, respectively. Flat connectors 324, 326 are made from a conductive material that is mounted on the connector holder 327. Flat connectors 324, 326 are conductively connected to wires 328, 330, respectively. When the recessed portion 305 is inserted into the top portion of the trunk section 302, the flat connectors 324, 326 engage springs 314, 316, respectively. Springs 314, 316 compress against the downward force of the flat connectors 324, 326, respectively. Springs 314, 316 are made from a conductive material, so that a solid connection is made between the flat connectors 324, 326 and springs 314, 316, respectively. The force generated by the springs 314, 316 holds the springs tightly against the flat connectors 324, 326. In this manner, a solid electrical connection or data electronic connection is made between the wires 320, 322 and wires 328, 330, respectively, to the springs 314, 316 and flat connectors 324, 326. Again, the weight of the trunk section 304, and the other trunk sections above trunk section 304, cause the springs 314, 316 to compress and generate a reactive force against the flat connectors 324, 326, so that movement of the tree does not cause the conductive path to be broken between the springs 314, 316 and flat connectors 324, 326. As indicated above, the neutral or ground signal is connected to the trunk section 302 in the trunk module 309. Alternatively, both the neutral or ground, plus the hot or positive signal, can be transmitted in wires through the interior portions of various trunk sections, such as trunk sections 302, 304, using the dual connector embodiment illustrated in FIG. 3. Alternatively, one of the connectors, such as wire 320, spring 314, flat connector 324, and wire 328 can be used to transmit data between the various trunk sections, such as trunk section 302 and trunk section 304. The data can be used to provide commands to the light strings connected to the various modules to perform various functions, such as flashing, chasing, color changing and other various controls that can be used to control the light strings.

Figure 4:
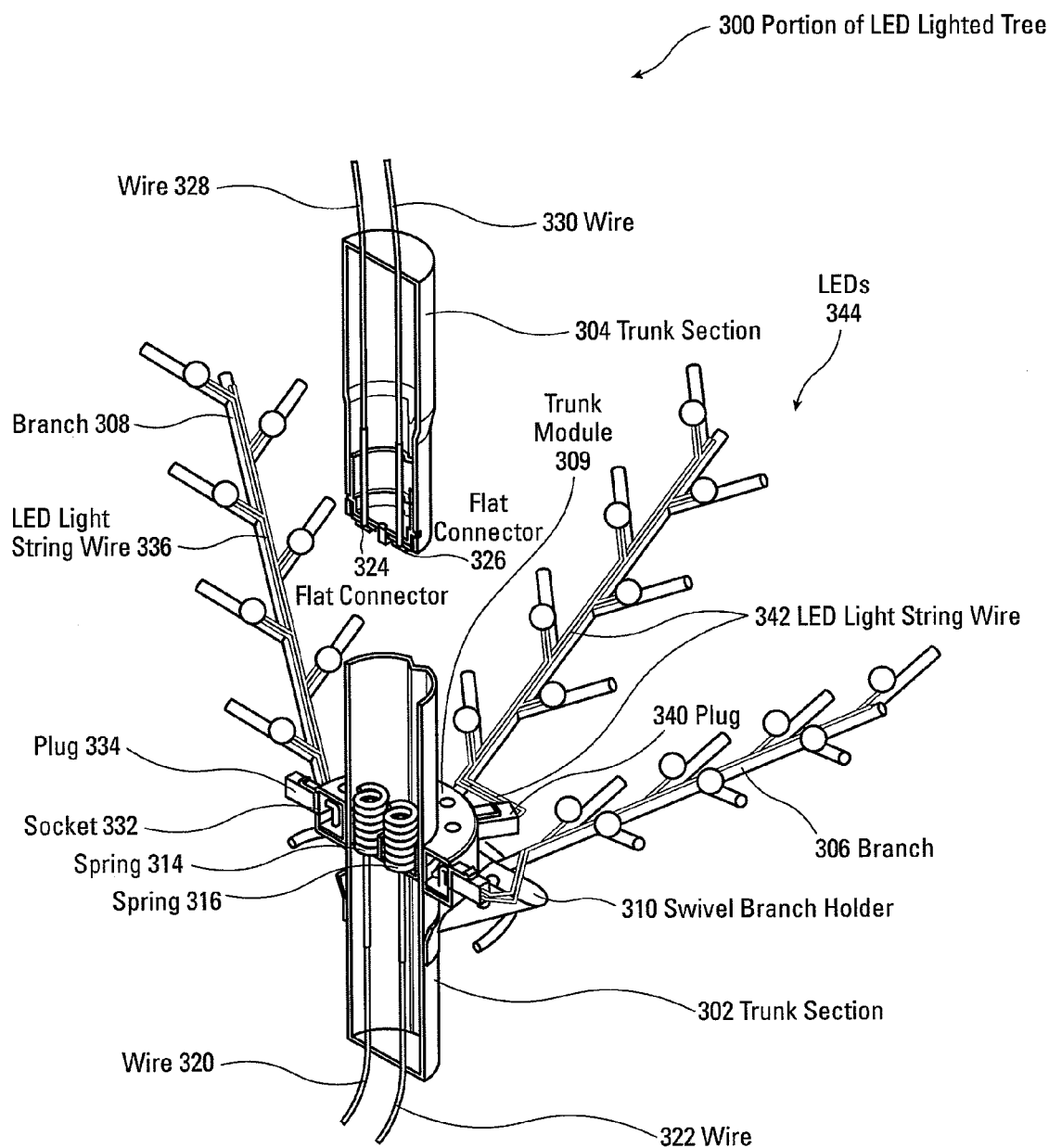
FIG. 4 is an isometric cross-sectional view of the portion of the LED lighted tree illustrated in FIG. 3.

FIG. 4 is an isometric cross-sectional view of the portion of the LED lighted tree 300 illustrated in FIG. 3. As shown in FIG. 4, the recessed portion 305 of trunk section 304 is inserted in the top portion of trunk section 302. Flat connectors 324, 326 engage springs 314, 316, respectively. The trunk section 304 compresses the flat connectors 324, 326 against the springs 314, 316, respectively, creating a solid electrical connection between wires 320, 322 and wires 328, 330, as described above with respect to FIG. 3. LEDs 344 are connected to an LED string wire 342. The LED string wire is connected to the plug 340, which plugs into a socket on the trunk module 309. Power to the socket, in which plug 340 is connected, is supplied by a printed circuit board (not shown) that generates either an AC or DC signal suitable for lighting the LEDs 344. Similarly, LED string wire 336 is connected to a plug 334 that is inserted in a socket 332 to obtain power for the LEDs on branch 308. Each of the branches has an associated individual light string that is connected to the trunk module 309 to receive power.

Figure 5:
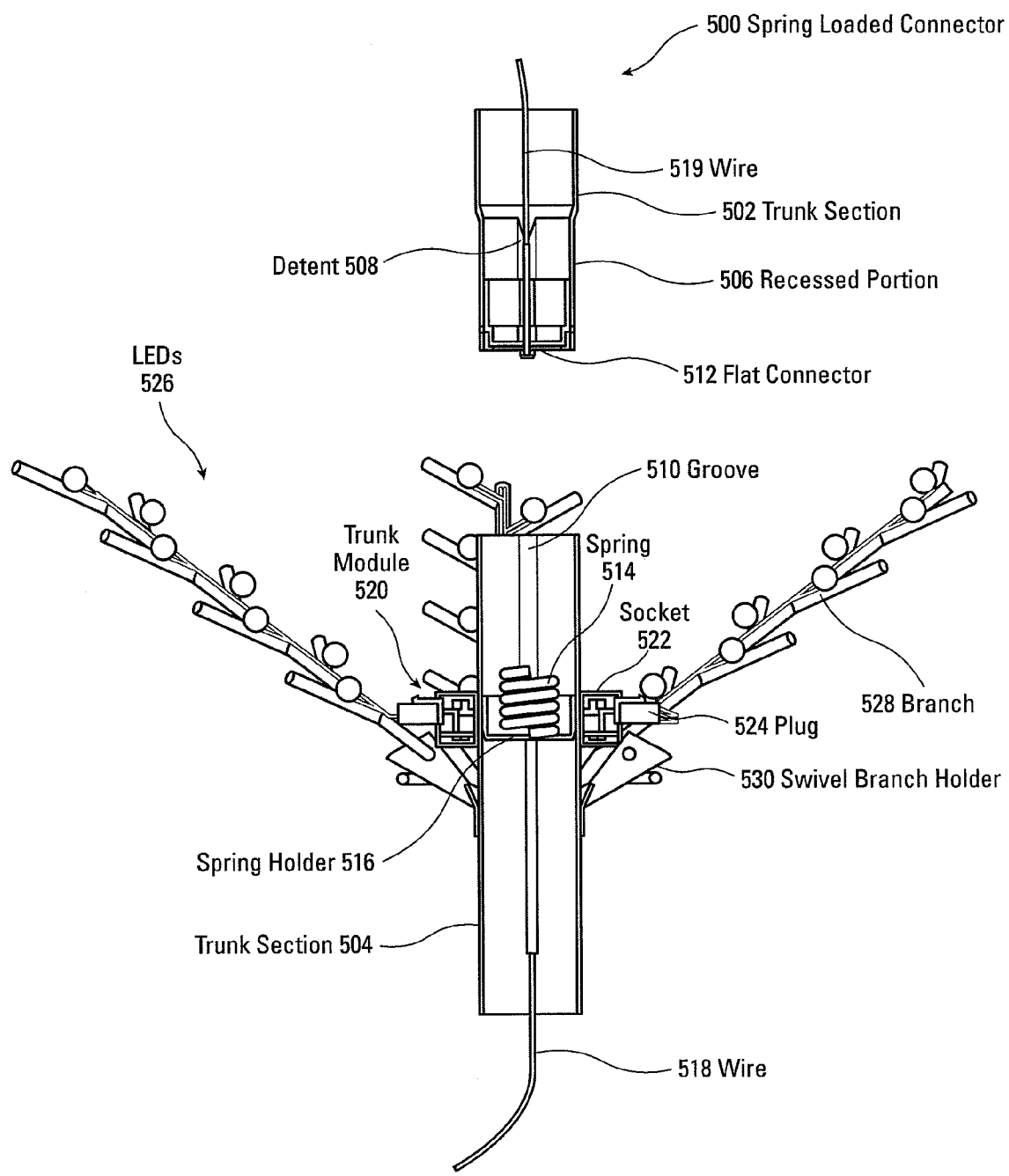
FIG. 5 is a cross-sectional view of another embodiment of an LED lighted tree.

FIG. 5 is a schematic cross-sectional view of an embodiment of a spring loaded connector 500. As illustrated in FIG. 5, trunk section 502 has a recessed portion 506 that fits within the inner diameter of trunk section 504. The optional detent 508 fits within the groove 510 to provide rotational orientation of trunk section 502 and trunk section 504. Spring 514 is mounted within the interior diameter of the trunk section 504 on a spring holder 516. The spring holder 516 may be made from a non-conductive material, so that the spring 514 is electrically isolated from the walls of the trunk section 504. Wire 518 is electrically connected to the spring 514, so that the spring 514 has an electrical potential. When the trunk section 502 is inserted into the inner diameter of the upper portion of the trunk section 504, the weight of the trunk section 502, and other trunk sections above trunk section 502, push trunk section 502 downwardly against the spring 514 to depress the spring 514 against the flat connector 512. In this manner, a solid electrical connection is created between the spring 514 and the flat connector 512 and wire 518 becomes electrically connected with wire 519 upon assembly of the trunk section 502 with trunk section 504.

As also illustrated in FIG. 5, trunk module 520 contains a plurality of sockets, such as socket 522. Plug 524, from the light string on branch 528, plugs into socket 522 to provide power to the LEDs 526 on branch 528. Branch 528 can be mounted, as shown, on a swivel connector 530.

Figure 6:
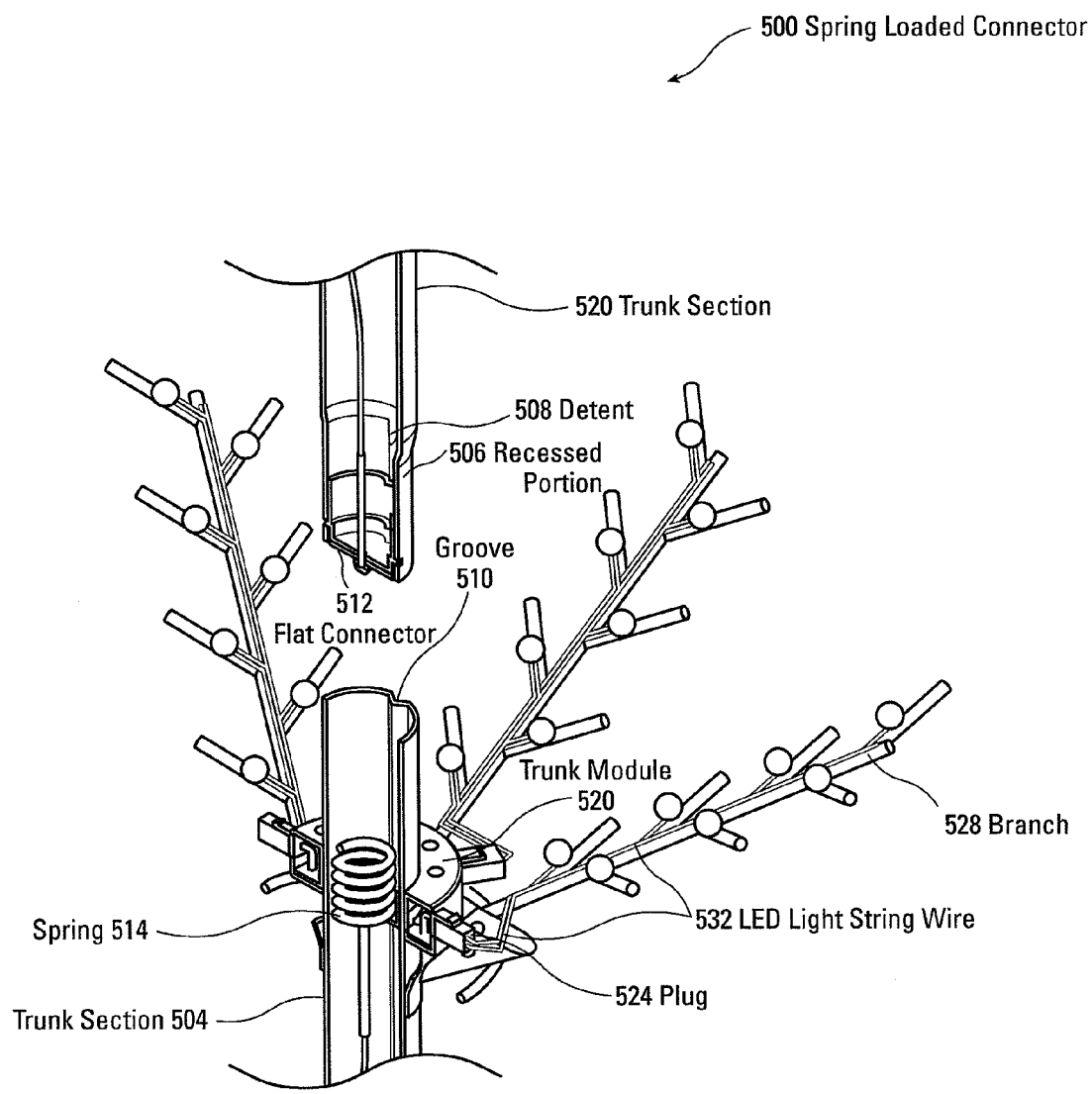
FIG. 6 is an isometric cross-sectional view of the portion of the LED lighted tree illustrated in FIG. 5.

FIG. 6 is an isometric cross-sectional view of the spring loaded connector 500 of FIG. 5. As illustrated in FIG. 6, the recessed portion 506 of trunk section 502 sits within the inner diameter of the upper portion of trunk section 504. Optional detent 508 engages groove 510 to provide rotational orientation of the trunk section 502 with trunk section 504. Spring 514 engages the flat connector 512 to create an electrical connection when the trunk section 502 is assembled with the trunk section 504. LEDs 526 are wired together on light string wire 532. Light string wire 532 is connected to the plug 524, which is inserted in a socket 534 in the trunk module 520.

FIG. 7A is a schematic top view of an embodiment of a printed circuit board assembly 700. As shown in FIG. 7, the printed circuit board assembly includes a printed circuit board 702 having a printed circuit board lead 706. The printed circuit board lead is connected to a plurality of branch leads 732, 734, 736, 738, 740, 742, 744, and 746. Each of the branch leads 732-746 are connected to a plurality of sockets 712, 714, 716, 718, 720, 722, 724, 726, respectively. The sockets 712-726 are mounted directly on the printed circuit board and provide a socket connection for light strings that are connected to the module in which the printed circuit board assembly 700 is mounted. In that regard, the printed circuit board 702 is mounted in a trunk module that is connected to the trunk 704. Power cord 710 has a wall plug 728 that supplies power to a converter 708. Converter 708 may comprise a voltage converter, such as a transformer, and/or a solid state converter that converts standard household AC power to a DC voltage. The converter 708 may be mounted directly on the printed circuit board 702 and to printed circuit board leads 730, 731. Power cord 710 passes through the central portion of the trunk 704 and passes out through an opening in the trunk 704 for connection to the converter 708. Printed circuit board lead 731 provides a DC zero voltage, or a neutral AC voltage, from the converter 708. Wire 748 connects the zero DC voltage, or neutral AC voltage, to the trunk 704, so that the trunk can carry one-half of the electric circuit. Safe voltages, such as voltages less than 30 volts, are created by converter 708 for safety purposes. The positive DC voltage, or hot AC voltage, of less than 30 volts, is provided to the printed circuit board lead 706 via branch printed circuit board lead 730. In this manner, each of the sockets 712-726 is provided with a single voltage supply from the printed circuit board lead 706, in parallel. In this manner, individual light strings can be connected to each of the sockets 712-726, in parallel.

FIG. 7B illustrates another embodiment of a printed circuit board assembly 750. As illustrated in FIG. 7B, the printed circuit board assembly includes a printed circuit board 766 that includes a printed circuit board lead 762. Wall plug 752 can be plugged into a wall socket (not shown) to obtain power. Standard household power is provided to the wall plug 752, which is transmitted to a converter 754. Converter 754 may comprise a solid state converter that is capable of converting the standard household AC power to either a low voltage AC power of less than approximately 30 volts, or to a DC voltage of less than approximately 30 volts. Converter 754 may constitute any desired type of converter, including a solid state converter or a small transformer. Suitable converters are disclosed in U.S. Pat. No. 8,314,564, entitled "Capacitive Full Wave Circuit for LED Light Strings," issued Nov. 20, 2012, to Jingling Yu and Lianfeng Ma; U.S. Pat. No. 7,518,316, entitled "Half-Wave Rectification Circuit with a Low-Pass Filter for LED Light Strings," issued Apr. 14, 2009, to Jingling Yu; U.S. Pat. No. 7,661,852, entitled "Integrated LED Bulb," issued Feb. 16, 2010, to JingJing Yu, and U.S. patent application Ser. No. 12/834,949, by Long Chen, Beijing Yu and JingJing Yu, entitled "Compact Inverter Plug for LED Light Strings," published Mar. 3, 2011, as U.S. Publication 2011/0051471, all of which are specifically incorporated herein by reference for all that they disclose and teach. The converter 554 is connected to a power cord 556, which includes a positive lead 758 and a negative or neutral lead 760. The positive lead 758 is connected to the PCB lead 762, while the negative or neutral lead 760 is connected to the trunk 764. In this manner, low voltage power in either AC or DC form is supplied to the printed circuit board assembly 750, so that higher voltage power does not enter the lighted LED tree, which provides a further margin of safety.

FIG. 8 is a schematic top view of an embodiment of a printed circuit board assembly 800. As illustrated in FIG. 8, the printed circuit board 802 provides both sides of the circuit to each of the sockets. Printed circuit board 802 includes a positive printed circuit board lead 806 and a negative printed circuit board lead 826. Sockets 810, 812, 814, 816, 818, 820, 822, 824 are mounted on the printed circuit board 802. The positive printed circuit board lead 806 is connected to positive printed circuit board connector 850, which provides the positive DC voltage, or hot AC voltage, to socket 810. Negative printed circuit board lead 826 is connected to negative printed circuit board connector 830 to provide the negative DC voltage, or neutral AC voltage, to socket 810. In this manner, socket 810 includes connections for both sides of the power circuit. As such, the plug from the LED light string is connected to both sides of the power circuit, rather than obtaining the zero DC voltage, or neutral AC voltage, through the metal tree trunk 804, such as illustrated in FIG. 7. Similarly, socket 812 is connected to the positive PCB lead 806 via positive PCB connector 852. Socket 812 is connected to the negative PCB lead 826 via negative PCB connector 832. Similarly, sockets 814, 816, 818, 820, 822 and 824 are connected to the positive PCB lead 806 via positive PCB connectors 854, 856, 858, 860, 862, 864. Sockets 814-824 are connected to the negative PCB lead 826 via negative PCB connectors 834, 836, 838, 840, 842 and 844, respectively. Power cord 809 includes a wall plug 828 for connecting to standard household power. The power cord 809 extends through the interior portion of the trunk 804 and passes through an opening for connection to the controller 846. Controller 846 is connected to converter 808 which converts the standard household power to either a DC voltage under 30 volts, or an AC voltage having a peak voltage of under 30 volts. Converter 808 is connected directly to both the positive PCB lead 806 and negative PCB lead 826.

As also shown in FIG. 8, controller 846, which provides control signals via connector 866 to converter 808, controls the operation of the converter 808. An IR detector, or RF antenna, 848 receives control signals from a remote controller device that are transmitted to the controller 846 to modify the operation of the controller 846. The IR detector 848 can be a standard IR detector, such as used in well known remote control devices. In addition, an RF antenna can be used, so that RF signals can be generated to control the controller 846. The RF antenna 848 may comprise a patch antenna or other antenna suitable for receiving RF signals. For example, the RF antenna 848 may be adapted to receive WiFi signals, so that the controller 846 can be controlled by devices connected to the Internet. In that regard, a computer or smart phone can be used to transmit WiFi signals to the RF antenna 848, which are used to control the controller 846, as set forth in more detail with respect to FIG. 12. In this manner, the lights connected to the sockets 810-824 can be turned on and off using an Internet connected device and other functions can be provided by the controller 846. As one example, an application can be written for a smart phone which allows the user to turn the tree lights on and off from a remote location over the Internet. Further, the controller 846 may be able to control the converter 808 to switch the polarity of the output of the converter 808, so that the positive PCB lead 806 becomes the negative lead and the negative PCB lead 826 becomes the positive PCB lead. The LEDs in the light string may be multicolored LEDs that have a first color connected in a first direction in the LED bulb and a second color connected in a second direction in the LED bulb. By switching polarity of the leads 806, 826, current can flow in an opposite direction, so that the LED lights located on the strings change color. Further, controller 846 can be used to cause the LED lights on the LED strings to flash at different desired intervals and phases. Controller 846, in that regard, may include a simple and inexpensive microprocessor that generates control signals via connector 866 to control the converter 808.

FIG. 9 is a schematic top view of another embodiment of a printed circuit board assembly 900. As illustrated in FIG. 9, the printed circuit board assembly 900 includes a printed circuit board 902 having a printed circuit board lead 906. Power cord 910 is connected to standard household power. Power cord 910 extends to the interior portion of trunk 904 and passes through an opening in the trunk 904 for connection to a transformer 908. The output of the transformer is a lower voltage signal, such as an AC signal, that has a peak voltage of less than 30 volts. The transformer output has a hot wire 928 that is connected to the printed circuit board lead 906. The neutral wire 930 is connected to the trunk 904, so that the neutral side of the AC power is transmitted through the trunk 904 of the tree. The PCB lead 906 is connected to each of the sockets 912, 914, 916, 918, 920, 922, 924, 926. Sockets 912-926 provide the hot power to the light strings that are connected to the sockets 912, 926. The neutral side of the circuit is provided through the tree trunk in the metal tree branches that are connected to the metal trunk 904. Again, power is provided to a series of individual light strings that are all connected in parallel to a single power supply provided by PCB lead 906. Each of the sockets 912-926 is substantially aligned with a tree branch, so that each individual tree branch has a separate LED light string. Of course, the advantage of providing individual light strings is that if there is a failure of a light string, an individual light string can be easily replaced by unplugging the light string from the socket and replacing it with a new light string. If a light string is integrally wired with a branch, the entire branch, with the light string, may be replaced as an alternative to simply replacing the light string.

Although each of the printed circuit boards illustrated in FIGS. 7, 8 and 9 show eight sockets, any number of sockets and corresponding branches can be utilized. For example, some of the modules that are located on lower trunk sections may have eight or ten branches and corresponding sockets, while upper modules may have, for example, only four sockets and corresponding branches. In that regard, the branches may have different lengths and a different number of LEDs, depending upon the level of the module in the tree. For longer branches, more LEDs may be used. Shorter branches, toward the top of the tree, will use fewer LEDs. As explained above, each of the printed circuit boards may provide different voltages to drive the different number of LEDs on each string, depending upon the level of the trunk module in the tree and the number of LEDs that are driven. Since a separate module is used for each set of branches in each set of lights at each level, the desired voltage can be provided by the converter on the printed circuit board lead for each trunk module. The power cord can be provided to each printed circuit board at each level, or the down converted voltage from each printed circuit board can be provided to the next higher printed circuit board in the series of trunk modules. As such, a transformer, such as transformer 908, may be used at each different level.

Figure 10:
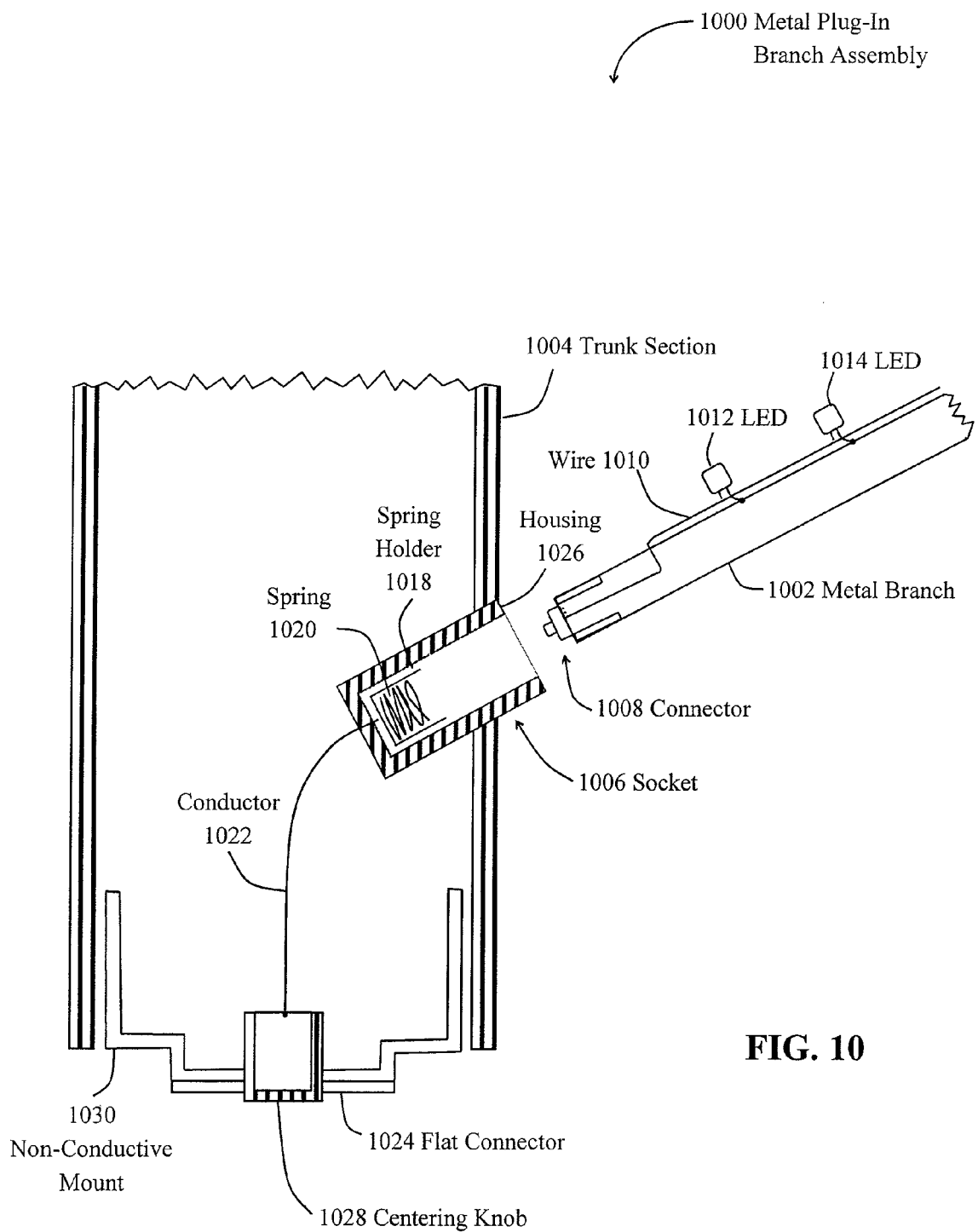
FIG. 10 is a schematic illustration of an embodiment of a metal plug-in branch assembly.

FIG. 10 is a schematic illustration of an embodiment of a metal plug-in branch assembly 1000. As illustrated in FIG. 10, the metal plug-in branch assembly 1000 includes a metal branch 1002 and a trunk section 1004. A socket 1006 is mounted in the trunk section 1004 at an upward angle. Socket 1006 functions as a structural mount for the metal branch 1002, and also includes an electrical connection to provide power to light the LEDs 1012 and 1014. The socket 1006 includes a socket housing 1026 that is made of a conductive material, such as metal. Housing 1026 is mounted in the metal trunk section 1004 so that there is electrical conductivity between the housing 1026 and the trunk section 1004. As illustrated in previous embodiments, the neutral or zero voltage is provided via the trunk section 1004, which is conductively connected to the housing 1026. Housing 1026 is sized to provide a friction fit with the metal branch 1002, so that the metal branch 1002 is conductively connected to the housing 1026 and trunk section 1004. Socket 1006 also includes a spring holder 1018 that is made of an electrically insulating material that holds the conductive spring 1020 in the socket 1006. Conductor 1022 passes through the housing 1026 and is conductively connected to the spring 1020. A flat connector 1008 is provided at the end of the metal branch 1002 and is electrically isolated from the metal branch 1002. Wire 1010 is connected to the flat connector 1008 and provides power to the LEDs 1012, 1014. LEDs 1012, 1014 are connected on one lead to the wire 1010 and on the other lead directly to the metal branch 1002. When the metal branch 1002 is inserted in the housing 1026, the friction fit between the metal branch 1002 and the housing 1026 creates an electrical connection between the metal branch 1002 and housing 1026 to conduct neutral or zero DC current. Insertion of the metal branch 1002 also causes the flat connector 1008 to compress the spring 1020 and provide an electrical connection between the spring 1020 and the flat connector 1008. The weight of the metal branch 1002, as well as the friction provided between the housing 1026 and the metal branch 1002, cause the spring 1020 to be compressed and remain in a compressed configuration while the metal branch 1002 is disposed in the socket 1006.

As also disclosed in FIG. 10, flat connector 1024 is located on a lower end of the trunk section 1004. Flat connector 1024 interfaces with a conductive spring in a lower trunk section (not shown). Centering knob 1028 forms a portion of the flat connector 1024, which centers the spring on the flat connector 1024. Non-conductive mount 1030 provides a stable mounting platform for the flat connector 1024 and is non-conductive so that the flat connector 1024 is not conductively connected to the trunk section 1004. Flat connector 1008 is constructed in a manner similar to the flat connector 1024 and includes a non-conductive mount, similar to non-conductive mount 1030, so that the flat connector is conductively isolated from the metal branch 1002. Flat connector 1008 also includes a centering knob, which centers the flat connector 1008 on the spring 1020.

Figure 11:
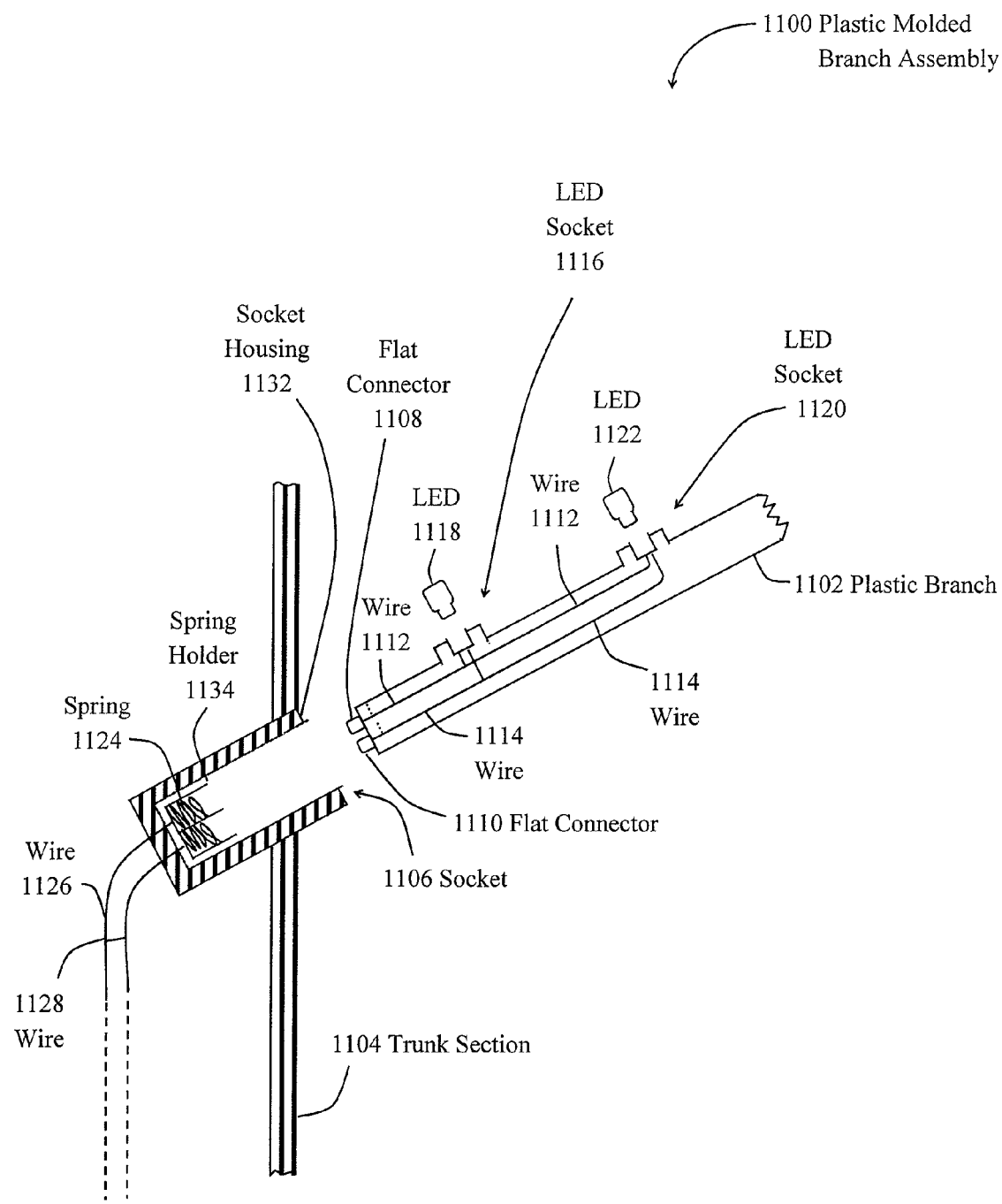
FIG. 11 is a schematic illustration of an embodiment of a plastic molded branch assembly.

FIG. 11 is a schematic illustration of an embodiment of a plastic molded branch assembly 1100. As illustrated in FIG. 11, the plastic molded branch assembly 1100 includes a plastic branch 1102 and a trunk section 1104. A socket 1106 is mounted in an upward direction in the trunk section 1104. The embodiment of FIG. 11 does not use the conduction of the trunk section 1104 for completing a circuit. Rather, both sides of the electrical circuit are transmitted through individual wired circuit sections that form a light string. Accordingly, the socket housing 1132 can be constructed from a non-conductive material, as well as the trunk section 1104. The socket 1106 includes springs 1124, 1130 that are connected to wires 1126, 1128, respectively. The spring holder 1134 has a center separating device that separates the springs 1124, 1130 so that the circuit is not shorted out. Flat connectors 1108, 1110 are mounted at the end of the plastic branch 1102. The flat connectors are similar to the flat connectors illustrated in FIG. 10, which provide a solid electrical connection between the flat connectors 1108, 1110 and springs 1124, 1130. Plastic branch 1102 is sized to provide a friction fit within the inner surface of the socket housing 1132, so that the flat connectors 1108, 1110 compress the springs 1124, 1130, respectively, to create a solid electrical connection when the plastic branch 1102 is inserted in the socket 1106. Wire 1126 is connected to spring 1124 and provides one-half of the circuit for lighting the LED lights, such as LEDs 1118, 1122. Spring 1130 is conductively connected to wire 1128 that provides the other half of the circuit for lighting the LEDs. The plastic branch 1102 can be molded using plastic injection molding techniques to form the entire branch, including the minor branches and the needles or leaves that are attached to the branches. Wires 1112, 1114 can be molded within the interior portion of the plastic branch 1102, so that no exterior wires appear on the plastic branch 1102. In addition, LED sockets, such as LED sockets 1116, 1120, can also be formed during the molding process. LEDs, such as LED 1118 and LED 1122, can then be inserted directly into the sockets 1116, 1120, respectively, directly on the plastic branch 1102. The electrical connections within the sockets, such as socket 1116, 1120, can be easily formed so that a solid electric connection can be made between the LED 1118 and socket 1116 and LED 1122 and socket 1120. For example, connections such as disclosed in U.S. Pat. No. 7,883,261, entitled "Water-Resistant and Replaceable LED Lamps," filed Oct. 20, 2008, by Jing Jing Yu, U.S. Pat. No. 7,784,993, entitled "Watertight LED Lamp," filed Jul. 12, 2008, by Jing Jing Yu, and U.S. Pat. No. 8,3786,606, entitled "Water Resistant and Replaceable LED Lamps for Light Strings," filed Oct. 30, 2009, by Jing Jing Yu, all of which are specifically incorporated herein by reference for all that they disclose and teach, can be used, as well as other types of electrical connections that can be formed within a plastic injection molded socket.

The embodiment of the plastic molded branch assembly of FIG. 11 provides certain advantages. For example, the wires 1112, 1114 are not visible on the plastic branch 1102. Further, the plastic branch 1102 can be mass-produced in an injection molding process to reduce costs. Further, the cost of additional sockets in the light string is eliminated, since the sockets are molded directly into the plastic branch 1102. Further, if there is a problem with a branch, the entire branch can be replaced in a simple and easy manner by simply unplugging the faulty branch and plugging a new branch into the socket 1106. Owners do not have to dispose of the entire tree, but can simply go to a local store and purchase a different branch. Further, if a problem exists in the socket 1106, the trunk section 1104 can be easily replaced. All of these advantages save time and money for the owner of the tree.

Figure 12:
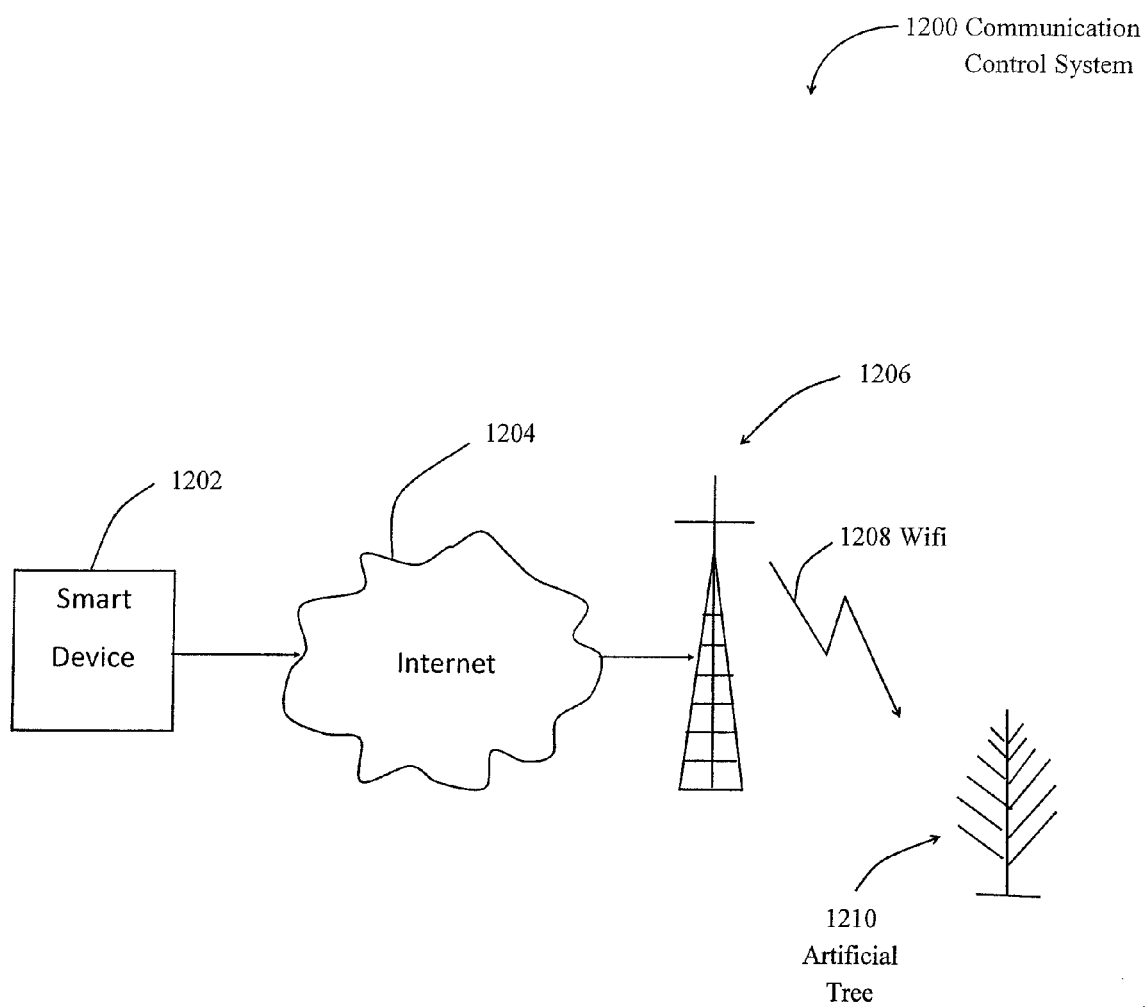
FIG. 12 is a schematic illustration of a communication control system.

FIG. 12 is a schematic illustration of an embodiment of a communication control system 1200. As shown in FIG. 12, a smart device 1202, such as a computer, smart phone, or similar device, can be loaded with an application for controlling the operation of the artificial tree 1210. This smart device 1202 is connected to the Internet 1204. The Internet 1204 is connected to the WiFi antenna 1206, which generates a WiFi signal 1208 that is transmitted to the artificial tree 1210. An antenna, such as RF antenna 848, is connected to a controller 846, such as illustrated in FIG. 8. The RF antenna 848 receives the WiFi transmission 1208 on the artificial tree 1210 and transmits the control signals from the smart device 1202, that are generated by an application on the smart device 1202, to control the controller 846.

Accordingly, the various embodiments disclosed herein are unique and solve many of the problems relating to artificial trees. Not only do these embodiments eliminate many of the problems associated with prior art artificial trees, but are also less expensive to implement and provide a more aesthetically pleasing tree.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An artificial tree comprising:
    a plurality of trunk sections that are adapted to be assembled to form a tree trunk, said plurality of trunk sections having diameters that fit together to mechanically connect said trunk;
    a plurality of artificial branches;
    a plurality of individual LED light strings disposed on said artificial branches;
    a plurality of trunk modules disposed on said plurality of trunk sections, each of said trunk modules of said plurality of trunk modules providing a single power source that is connected to a plurality of electrical light string connectors that connect said individual LED light strings to said single power source in parallel;
    a plurality of trunk section flat spring connectors that connect electrical power between said trunk sections comprising:
        springs that are electrically connected to said power modules in said trunk modules of said trunk section;
        connector plates that are electrically connected to said power modules of adjacent trunk sections, said connector plates disposed in said adjacent trunk sections to engage said springs in said trunk sections when said trunk sections are assembled, causing said springs to compress against said connector plates and provide a solid electrical connection between said springs and said connector plates so that said electrical power is conducted between said trunk sections when said trunk sections are assembled.

2. The artificial tree of claim 1 further comprising:
    centering knobs disposed on said connector plates that engage a central opening in said springs that substantially centers said connector plate with said springs.

3. The artificial tree of claim 1 wherein said artificial branches are plastic molded injection branches.

4. The artificial tree of claim 3 wherein said individual light strings are molded into said plastic molded injection branches.

5. The artificial tree of claim 4 wherein said artificial branches are molded with LED sockets for insertion of LEDs in said LED sockets.

6. The artificial tree of claim 5 wherein said electrical light string connectors comprise light string flat spring connectors comprising:
    a spring that is connected to said power supplies in said trunk modules;
    connector plates that are connected to said light strings.

7. The artificial tree of claim 1 wherein said trunk modules have converters that convert standard household power to a lower voltage level on a printed circuit board mounted in said trunk module.

8. The artificial tree of claim 7 wherein said converters comprise a transformer so that said single power source comprises an AC power source.

9. The artificial tree of claim 7 wherein said converters comprise solid state converters that convert said standard household power to DC power.

10. The artificial tree of claim 7 wherein said plurality of trunk sections and said plurality of artificial branches are constructed from a conductive material so that neutral AC power or zero DC power is transmitted in said artificial tree through said plurality of trunk sections and said plurality of artificial branches.

11. The artificial tree of claim 1 further comprising:
    controllers disposed in said trunk modules that control operation of said single power source.

12. The artificial tree of claim 11 further comprising:
    radio frequency antennas coupled to said controllers that receive radio frequency control signals for controlling said controllers.

13. The artificial tree of claim 12 wherein said radio frequency control signals are WiFi control signals generated by an Internet connected smart device.

14. The artificial tree of claim 11 further comprising:
    infrared detectors coupled to said controllers that receive infrared control signals from an infrared remote controller device for controlling said controllers.

15. A method of assembling an artificial tree comprising:
providing a plurality of trunk sections, said plurality of trunk sections having diameters that fit together to form a tree trunk;
connecting a plurality of trunk modules to said trunk sections;
connecting a plurality of artificial branches to said plurality of trunk modules;
providing a plurality of individual light strings on said plurality of artificial branches;
connecting said plurality of individual light strings to a single power source in said plurality of trunk modules when said plurality of artificial branches are connected to said trunk modules, so that said plurality of individual light strings are connected in parallel with said single power source in said each trunk module of said plurality of trunk modules;
providing a plurality of trunk section flat spring connectors in said trunk sections that connect electrical power between said trunk sections comprising:
providing springs that are electrically connected to power sources in said trunk modules of said trunk section;
providing connector plates that are electrically connected to said power sources in adjacent trunk sections;
assembling said trunk sections so that spring connectors disposed in said trunk sections provide an electrical conduction path for conduction of electrical power to said plurality of trunk sections, said connector plates engaging said springs in said adjacent trunk sections when said trunk sections are assembled causing said springs to compress and provide a solid electrical connection between said springs and said connector plates, which causes said electrical power to be conducted to said plurality of trunk sections.

16. The method of claim 15 further comprising:
engaging centering knobs on said springs that are disposed on said connector plates with central openings in said springs to substantially center said springs with said connector plates.

17. The method of claim 15 wherein said process of connecting said plurality of artificial branches to said plurality of trunk modules comprises:
connecting a plurality of plastic injection molded artificial branches with said individual light strings and LED sockets molded into said artificial branches to said plurality of trunk modules.

18. The method of claim 17 further comprising:
inserting said plurality of plastic injection molded artificial branches in trunk sockets so that plate connectors on said artificial branches compress springs in said trunk sockets that are connected to said single power source.

19. The method of claim 15 further comprising:
placing controllers on printed circuit boards in said plurality of trunk modules that control operation of said single power source.

20. The method of claim 19 further comprising:
placing radio frequency antennas in said plurality of trunk modules that are connected to said controller, said radio frequency antennas providing radio frequency control signals that control operation of said controllers.

21. The method of claim 20 wherein said radio frequency control signals are received over a WiFi connection from an Internet connected control device.

22. The method of claim 19 further comprising:
providing infrared detectors in said plurality of trunk modules that receive infrared control signals from an infrared remote controller for controlling said controllers.

23. The method of claim 15 further comprising:
providing converters in said trunk modules that convert said electrical power conducted in said trunk sections to a lower voltage.

24. The method of claim 23 wherein said converters transform an alternating current power signal to a lower voltage alternating current power signal using a transformer.

25. The method of claim 23 wherein said converters comprise solid state converters that connect said electrical power to direct current power.

26. The method of claim 24 further comprising:
providing said trunk sections and said artificial branches that are conductive;
connecting a neutral circuit of said lower voltage alternating current signal to said trunk sections so that said neutral circuit is transmitted in said artificial tree through said trunk sections and said artificial branches.

27. The method of claim 25 further comprising:
providing said trunk sections and said artificial branches that are conductive;
connecting a zero voltage circuit of said direct current power to said trunk sections so that said zero voltage circuit is transmitted un said artificial tree through said trunk sections and said artificial branches.

* * * * *